United States Patent [19]

Scholten et al.

[11] Patent Number: 4,712,675
[45] Date of Patent: Dec. 15, 1987

[54] TAPE PACKING FOR ELECTRICAL OR ELECTRONIC COMPONENTS

[75] Inventors: Gerard J. Scholten; Louis F. A. Dieleman; Johannes M. M. Blankers, all of Eindhoven, Netherlands

[73] Assignee: U.S. Philips Corporation, New York, N.Y.

[21] Appl. No.: 923,260

[22] Filed: Oct. 27, 1986

[30] Foreign Application Priority Data

Nov. 8, 1985 [NL] Netherlands ................. 8503063

[51] Int. Cl.⁴ ............................................. B65D 85/30
[52] U.S. Cl. .................................... 206/332; 206/328
[58] Field of Search ............... 206/328, 332, 329, 330; 357/69, 70

[56] References Cited

U.S. PATENT DOCUMENTS 3,946,864 3/1976 Hutson ........................ 206/332
4,193,287 3/1980 Pfeiffer ........................ 206/329
4,298,120 11/1981 Kaneko et al. ................. 206/329

FOREIGN PATENT DOCUMENTS 2083000 9/1980 United Kingdom ............. 206/330

Primary Examiner—Joseph Man-Fu Moy
Attorney, Agent, or Firm—Robert T. Mayer

[57] ABSTRACT

A tape packing for electrical or electronic components comprising a strip-shaped carrier with cavities for receiving the components and a covering foil. The carrier consists at least in part of metal and the cavities are formed by means of a cold drawing process. The side walls of the cavities, which are parallel to the longitudinal direction of the carrier, are provided with openings. The barriers between successive carriers, which are at right angles to the longitudinal direction of the carrier, are shaped so that their height is smaller than the depth of the cavities.

3 Claims, 3 Drawing Figures

TAPE PACKING FOR ELECTRICAL OR ELECTRONIC COMPONENTS

The invention relates to a tape packing for electrical-/or electronic components comprising a strip-shaped carrier, which consist at least in part of metal and is provided with cavities for receiving the components, which are formed in the longitudinal direction at regular relative distances by means of a cold drawing process and whose side walls extend parallel to and at right angles to, respectively, the longitudinal direction of the carrier, with edge zones extending on either side of the cavities in the longitudinal direction, with barriers at right angles to the longitudinal direction between the successive cavities and with at least one series of transport holes, the cavities provided with components being closed by a covering tape which is adhered to the edge zones.

The increasing trend of innovation and miniaturization has led in the electronic industry to the so-called surface mounting technology, which is known in international professional circles under the already commonly used abbreviation SMT. This term is to be understood to mean the placement of components on a substrate.

Components for surface mounting are designated by the abbreviation SMD (Surface-Mounted Devices). These components adapted and developed for surface mounting, also frequently designated as wireless components, are provided with contact faces or with comparatively short connection pins or connection legs and do not comprise the conventional comparatively long connection wires.

Depending upon the processing and mounting method used, these components are supplied in "bulk", in cartridges or in tape. The packing of the components in a tape has a number of advantages. Each component is stored in a separate chamber with the correct orientation. The packing in tape provides the possibility of supplying the correct component always in the same pick-up position and with the correct orientation to a mounting machine. The packing in tape promotes the recognizability of the components; although all the components are marked, most of the components are so small that it is not possible to provide them with a sufficiently clear and complete text. Only a simple code can be provided, which is moreover not always cleary legible. However, it is possible to indicate clearly on the tapes themselves and on the reels onto which the tapes are generally wound, what components are concerned.

It is known to compose such tapes for packing components intended for surface mounting of several layers of paper and cardboard. For tapes having a necessary thickness of more than about 0.7 mm, this material is less suitable because tape of cardboard having such a thickness is too rigid and cannot readily be wound. Due to the formation of fibres and delamination of these materials, disturbances in the further processing of the packed components may occur.

In order to obviate these disadvantages, it is known to use a tape of a thin synthetic material, in which cavities are formed by means of a hot drawing method. This hot-drawing process is comparatively slow and sensitive to disturbances. The accuracy to size of the hot-deformed tapes, more particularly of the pitch, is not stable in time. In view of the necessary operations, such as punching holes and forming cavities, which are preferably carried out "on line" with the filling machine, the slow process of hot-drawing the cavities is annoying.

It is further known to manufacture the tape from a material which consists at least in part of metal and in which the cavities are formed by means of a cold drawing process. The term "cold drawing process" is to be understood to mean herein a drawing process which is carried out at room temperature. This cold drawing process is quicker, more efficient and more suitable for "on line" production than the afore-mentioned hot-drawing method. Especially the cavities can be formed by means of this process in a controllable and reproducible manner.

A tape packing of the kind mentioned in the opening paragraph is known from U.S. Pat. No. 4,298,120. With the use of the cold drawing method for the manufacture of such a tape packing, cavities having a given maximum depth and having continuous crack-free walls can be formed in an accurate and reproducible manner. If cavities are formed having a comparatively large depth exceeding the said maximum depth and suitable for receiving comparatively large components, cracks are formed in the bottom and/or in the side walls of the cavities due to the comparatively large drawing ratios. Since the drawing ratio is largest in the direction at right angles to the longitudinal direction of the strip, cracks are first formed in the side walls parallel to the longitudinal direction of the strip. If the material is drawn further for forming cavities having an even larger depth, cracks are also formed in the side walls at right angles to the longitudinal direction of the strip because the drawing ratio now also becomes too large in the longitudinal direction of the strip. Because these cracks are formed in an uncontrollable manner, the cracks obtained are not defined, that is to say that the shape, the dimensions and the place of the cracks are arbitrary and not controllable. Cracks can be formed to such an extent that the bottom of the cavities is liable to become detached and the components are no longer enclosed with certainty. A tape packing the cavities of which exhibit cracks is unreliable and not acceptable.

The invention has for its object to provide a tape packing, which can be manufactured in an efficient, economical and reproducible manner and whose cavities, in spite of a comparatively large depth, are free from uncontrolled cracks.

According to the invention, this object is mainly achieved in that the side walls of the cavities, which are parallel to the longitudinal direction of the strip-shaped carrier, are provided with openings, which are limited inter alia by the relevant edge zone. When an opening is formed intentionally in the said side walls, at any rate the place, the dimension and the shape of the opening can be influenced and defined. The openings can be obtained by providing at given predetermined areas in the strip-shaped carrier a defined cut, incision or crack before or during the formation of the cavities, as a result of which the drawing ratio in the direction at right angles to the strip-shaped carrier is reduced and an arbitrary crack formation is avoided. During the formation of the cavities, the cuts are stretched in a reproducible manner to form openings having a given shape, place and dimensions. Experiments have shown that due to the measures according to the invention the depth of the cavities can be increased by about 40% without arbitrary crack formation occurring.

A preferred embodiment of the tape packing according to the invention is characterized in that the height of the barriers, at least over the major part of their length, is smaller than the depth of the cavities, calculated from the edge zones. In other words: the level of the barriers is reduced with respect to the level of the edge zones in the direction of the bottom of the cavities, as a result of which the drawing ratio in the longitudinal direction of the carrier is also reduced and crack formation in the side walls at right angles to the longitudinal direction of the carrier is also avoided. It has been found that by this measure the depth of the cavities can be further increased by 15% without an undesired crack formation occurring.

A further preferred embodiment of the tape packing according to the invention is characterized in that the strip-shaped carrier consists of a composite multilayer foil of metal and synthetic material. This material is known and is frequently used as packing material in the food industry. This material is composed of three layers, i.e. a layer of polyvinylchloride having a thickness of about 150 μm, a layer of aluminium foil having a thickness of about 50 μm and a layer of polyamide having a thickness of about 50 μm. This material is particularly suitable to be processed at room temperature by means of a cold drawing process. This material has the particular advantage that immediately after the cold deformation the mechanical stresses produced in the two layers of synthetic material are neutralized for the major part by the comparatively rigid aluminium foil enclosed between the two layers of synthetic material. When this material is used for the strip-shaped carrier, a comparatively inexpensive tape packing of very high quality is obtained. Although the quality of this comparatively expensive material is high, the cost of the ultimate product, i.e. the cost of the packing per packed component, is comparatively low due to the attainable high production rate of the cold drawing process of about 100,000 cavities per hour.

U.S. Pat. No. 4,266,416 discloses a method of forming cavities having a comparatively large volume in a material consisting of a composite multilayer foil of aluminium and synthetic material. For this purpose, the foil is first pre-stretched by means of a pressure medium and is then shaped into the desired form. Since this two-step method is comparatively slow, this process is not suitable either for efficiently and economically manufacturing tape packings according to the invention.

The invention will be described more fully with reference to the drawing. In the drawing.

Figure 1:
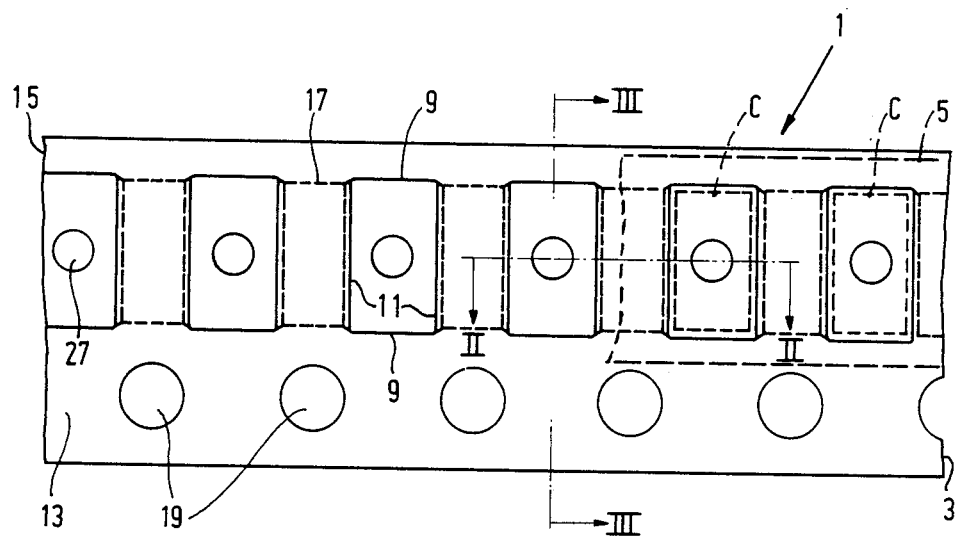
FIG. 1 shows an embodiment of a tape packing according to the invention in elevation.
Figure 2:
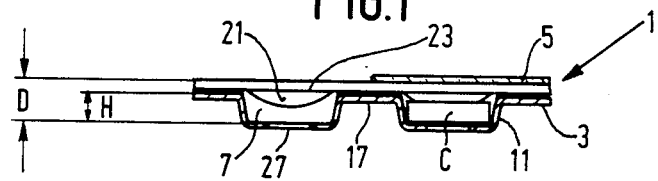
FIG. 2 shows the tape packing in longitudinal sectional view taken on the line II—II in FIG. 1.
Figure 3:
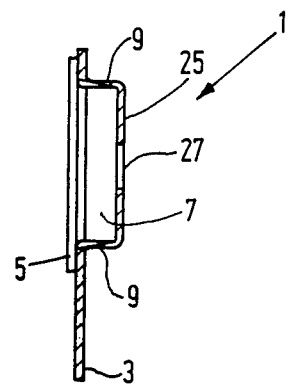
FIG. 3 shows the tape packing in cross-section taken on the line III—III in FIG. 1.

The tape packing 1 shown in the drawing for electronic and/or electric components C consists of two parts, i.e. a strip-shaped carrier 3 and a covering tape 5. By means of the cold drawing process already described, cavities 7 for receiving the components C are formed in the carrier 3 at regular relative distances. In the embodiment shown, the cavities 7 are elongated with their narrow side walls 9 parallel to the longitudinal direction of the carrier 3; the long side-walls 11 of the cavities 7 are at right angles to the carrier 3. Reference numerals 13 and 15 designate two edge zones, which extend on either side of the cavities 7 in the longitudinal direction of the carrier 3. Reference numeral 17 denotes barriers between the successive cavities 7, which barriers are at right angles to the longitudinal direction of the carrier 3. The wider edge zone 13 is provided with a series of transport holes 19. Preferably, the transport holes 19 are formed simultaneously with the cavities 7. The side walls 9 are provided with openings 21, which each are limited by the edge 23 of a previous incision on the edge zones 13 and 15, respectively. The step of providing the openings 21 is further described already hereinbefore. If desired, a hole 27 may be punched into the bottom 25 of the cavities 7 and an ejection pin may be passed through this hole when processing the components. As a matter of course, the openings 21 do not extend as far as the bottom 25 of the cavities 7. The level of the barriers 17 is lowered with respect to the level of the edge zones 13 and 15 towards the bottom 25 of the cavities 7 in such a manner that the height H of the barriers 17 is smaller than the depth D of the cavities 7. The reduction of the barrier height depends upon the dimensions and the shape of the component to be received in the cavities, i.e. upon the required depth of the cavities.

As already set out above, the carrier 3 consists at least in part of metal and preferably of a multilayer foil of metal and synthetic material. The covering tape 5 is preferably hot-adhesive and is welded by heat onto the edge zones 13 and 15. A covering tape used in practice consists of a foil of synthetic material which may be transparent and which is covered on one side with an adhesive layer that can be activated by heat. The covering tape 5 generally has a thickness of about 50 μm.

In the embodiment shown, the openings 21 are in the form of a lens. If desired or required, openings having a different profile, for example rectangular openings, may also be provided.

What is claimed is:

1. A tape packing for electrical or electronic components comprising a strip-shaped carrier with lateral and longitudinal dimensions and formed at least in part of metal, said carrier having cavities for receiving the components, said cavities being formed along the longitudinal dimension at regular distances by means of a cold drawing process and having side walls which extend along the longitudinal dimension of the carrier and at right angles thereto, said carrier including edge zones extending on either side of the cavities along the longitudinal dimension, barriers at right angles to the longitudinal dimension between successive cavities, at least one series of transport holes, and a covering tape closing the cavities, said covering tape adhering to the edge zones, and wherein the side walls of the cavities, which extend along the longitudinal dimension of the strip-shaped carrier, are provided with openings, which are bounded by an associated edge zone.

2. A tape packing as claimed in claim 1, wherein the height of the barriers, at least over the major part of their length, is smaller than the depth of the cavities, plus the height of the edge zones.

3. A tape packing as claimed in claim 1 or 2, wherein the strip-shaped carrier consists of a composite multilayer foil of metal and synthetic material.

* * * * *